United States Patent
Lin

(10) Patent No.: US 10,204,699 B2
(45) Date of Patent: *Feb. 12, 2019

(54) METHODS FOR MIGRATING DATA TO AVOID READ DISTURBANCE AND APPARATUSES USING THE SAME

(71) Applicant: Shannon Systems Ltd., Shanghai (CN)

(72) Inventor: Ting-Kuan Lin, Hemei Township, Changhua County (TW)

(73) Assignee: SHANNON SYSTEMS LTD., Shanghai (CN)

(*) Notice: Subject to any disclaimer, the term of this patent is extended or adjusted under 35 U.S.C. 154(b) by 32 days.

This patent is subject to a terminal disclaimer.

(21) Appl. No.: 15/633,984

(22) Filed: Jun. 27, 2017

(65) Prior Publication Data

US 2018/0261299 A1    Sep. 13, 2018

(30) Foreign Application Priority Data

Mar. 9, 2017    (CN) .......................... 2017 1 0137004

(51) Int. Cl.
*G11C 29/42*    (2006.01)
*G06F 3/06*    (2006.01)
(Continued)

(52) U.S. Cl.
CPC .............. *G11C 29/42* (2013.01); *G06F 3/065* (2013.01); *G06F 3/0619* (2013.01);
(Continued)

(58) Field of Classification Search
CPC ......... G11C 29/42; G11C 29/44; G11C 29/52; G06F 3/0619; G06F 3/0647; G06F 3/065; G06F 3/0685; G06F 11/1068
See application file for complete search history.

(56) References Cited

U.S. PATENT DOCUMENTS 9,229,642 B2    1/2016    Shu et al.
9,361,182 B2    6/2016    Hu et al.
(Continued)

FOREIGN PATENT DOCUMENTS

CN    104934066 A    9/2015
TW    201545161 A    12/2015
(Continued)

*Primary Examiner* — Kyle Vallecillo
(74) *Attorney, Agent, or Firm* — McClure, Qualey & Rodack, LLP

(57) ABSTRACT

A method for migrating data to avoid read disturbance is introduced to contain the following steps: obtaining first read counts corresponding to physical blocks from a first read-count table; obtaining second read counts corresponding to the physical blocks from a second read-count table; subtracting each first read count from one corresponding second read count to generate third read counts; finding a singular physical-block from physical blocks according to the third read counts; performing a test read on data of the $i^{th}$ physical page of the singular physical-block; determining whether the data of the $i^{th}$ physical page of the singular physical block has passed the test read; and if so, moving or copying data of the $i^{th}$ physical page and at least one neighboring physical-page of the singular physical block to an available physical-block.

20 Claims, 6 Drawing Sheets

(51) Int. Cl.
    *G11C 29/44*         (2006.01)
    *G06F 11/10*         (2006.01)
    *G11C 29/52*         (2006.01)

(52) U.S. Cl.
    CPC .......... *G06F 3/0647* (2013.01); *G06F 3/0685* (2013.01); *G06F 11/1068* (2013.01); *G11C 29/44* (2013.01); *G11C 29/52* (2013.01)

(56) References Cited

U.S. PATENT DOCUMENTS

| | | |
|---|---|---|
| 9,678,827 B2 | 6/2017 | Kim et al. |
| 2009/0265503 A1* | 10/2009 | Hung .................. G06F 12/0246 711/100 |
| 2012/0195117 A1 | 8/2012 | Han |
| 2013/0184999 A1* | 7/2013 | Ding ....................... G06F 19/18 702/19 |
| 2014/0244969 A1* | 8/2014 | Tagaya ................ G06F 9/30036 712/7 |
| 2016/0034194 A1 | 2/2016 | Brokhman et al. |
| 2018/0150261 A1* | 5/2018 | Nam ..................... G06F 3/0604 |
| 2018/0260156 A1* | 9/2018 | Lin ....................... G06F 3/0647 |

FOREIGN PATENT DOCUMENTS

| | | |
|---|---|---|
| TW | I520153 B | 2/2016 |
| TW | 201617840 A | 5/2016 |

\* cited by examiner

METHODS FOR MIGRATING DATA TO AVOID READ DISTURBANCE AND APPARATUSES USING THE SAME

CROSS REFERENCE TO RELATED APPLICATIONS

This Application claims priority of China Patent Application No. 201710137004.8, filed on Mar. 9, 2017, the entirety of which is incorporated by reference herein.

BACKGROUND

Technical Field

The present invention relates to flash memory devices, and in particular to methods for migrating data to avoid read disturbance and apparatuses using the same.

Description of the Related Art

Flash memory devices typically include NOR flash devices and NAND flash devices. NOR flash devices are random access—a host accessing a NOR flash device can provide the device with any address on its address pins and immediately retrieve data stored in that address on the device's data pins. NAND flash devices, on the other hand, are not random access but serial access. It is not possible for NOR to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. In reality, the NAND flash device always reads complete pages from the memory cells and writes complete pages to the memory cells. After a page of data is read from the array into a buffer inside the device, the host can access the data bytes or words one-by-one by serially clocking them out using a strobe signal.

Reading NAND flash memory may cause nearby physical blocks (or wordlines) to change over time (i.e. to become programmed). If one physical block is read from continually, that physical block will not fail but rather the surrounding physical block or blocks on subsequent reads will fail. The threshold number of reads between intervening erase operations is generally in the thousands of reads. This is known as read disturb. Accordingly, what is needed are methods for migrating data to avoid read disturbance and apparatuses using the same.

BRIEF SUMMARY

An embodiment of a method for migrating data to avoid read disturbance is introduced to contain the following steps: obtaining first read counts corresponding to physical blocks from a first read-count table; obtaining second read counts corresponding to the physical blocks from a second read-count table; subtracting each first read count from one corresponding second read count to generate third read counts; finding a singular physical-block from physical blocks according to the third read counts; performing a test read on data of the $i^{th}$ physical page of the singular physical-block; determining whether the data of the $i^{th}$ physical page of the singular physical block has passed the test read; and if so, moving or copying data of the $i^{th}$ physical page and at least one neighboring physical-page of the singular physical block to an available physical-block.

An embodiment of an apparatus for migrating data to avoid read disturbance is introduced to at least contain a volatile memory, an access interface and a processing unit. The volatile memory stores a first read-count table and a second read-count table. The access interface is coupled to a storage unit comprising physical blocks. The processing unit, coupled to the access interface, obtains first read counts corresponding to the physical blocks from the first read-count table, obtains second read counts corresponding to the physical blocks from the second read-count table, subtracts each first read count from one corresponding second read count so as to generate third read counts, finds a singular physical-block from the physical blocks according to the third read counts, performs a test read on data of the $i^{th}$ physical page of the singular physical-block and determines whether the data of the $i^{th}$ physical page of the singular physical block has passed the test read. When the data of the $i^{th}$ physical page of the singular physical block has not passed the test read, the processing unit directs the access interface to move or copy data of the $i^{th}$ physical page and at least one neighboring physical-page of the singular physical block to an available physical-block.

Each first read count indicates a total number of reads of one corresponding physical block in a time period between a first moment and a second moment. Each second read count indicates a total number of reads of one corresponding physical block in a time period between the second moment and a third moment. i is an integer that is greater than or equal to 0.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
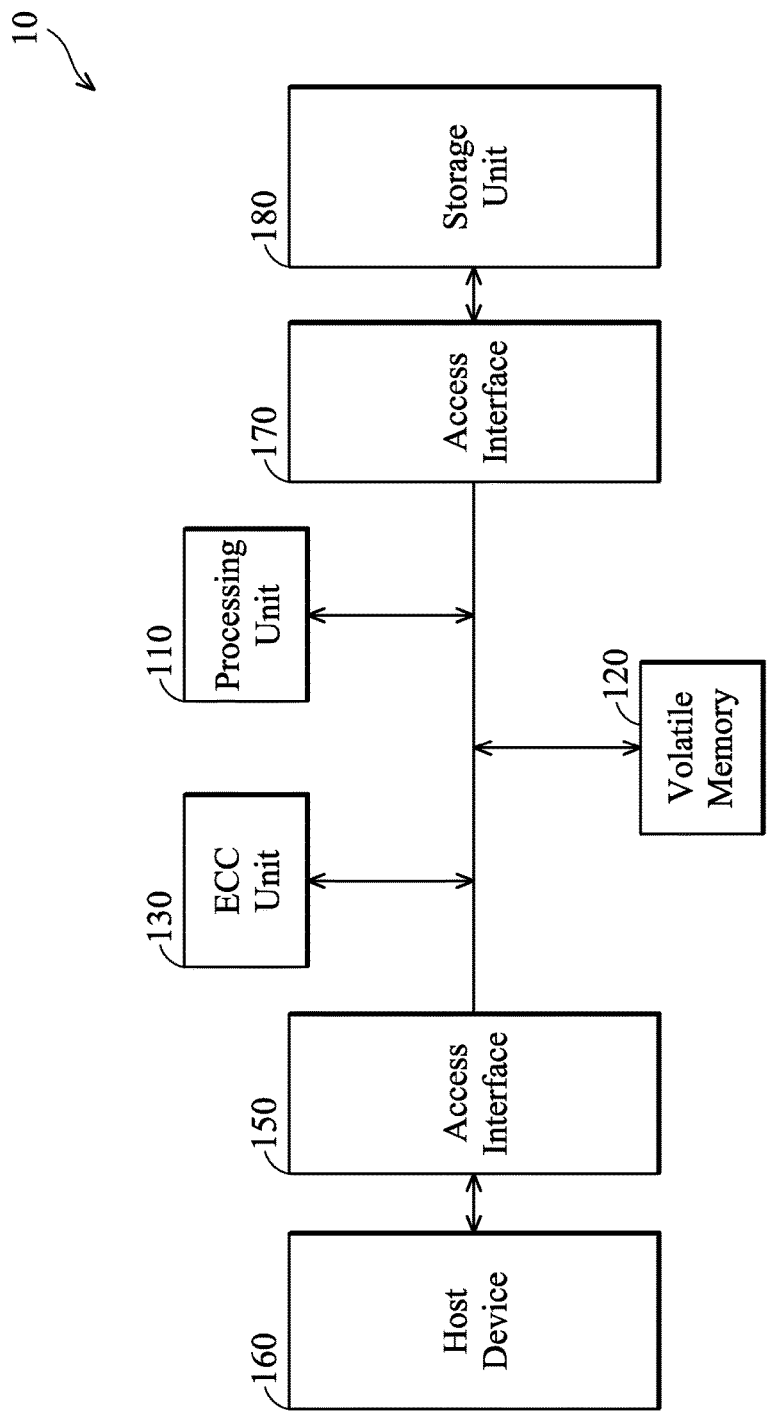
FIG. 1 is the system architecture of a flash memory according to an embodiment of the invention.

FIG. 1 is the system architecture of a flash memory according to an embodiment of the invention. The system architecture 10 of the flash memory contains a processing unit 110 configured to write data into a designated address of a storage unit 180, and read data from a designated address thereof. Specifically, the processing unit 110 writes data into a designated address of the storage unit 180 through an access interface 170 and reads data from a designated address thereof through the same interface 170. The processing unit 110 can be implemented in numerous ways, such as with dedicated hardware, or with general-purpose hardware (e.g., a single processor, multiple processors or graphics processing units capable of parallel computations, etc.) that is programmed using microcode or software instructions to perform the functions recited herein. The processing unit 110 fetches instructions from a FIFO (First-In-First-Output) buffer and directs the access interface 170 according to the fetched instructions. The processing unit 110 may contain one or more ALUs (Arithmetic and Logic Units) and bit shifters. The ALU is responsible for performing Boolean operations (such as AND, OR, NOT, NAND, NOR, XOR, XNOR etc.) and also for performing integer addition and subtraction. The bit shifter is responsible for bitwise shifts and rotations. The system architecture 10 uses several electrical signals for coordinating commands and data transfer between the processing unit 110 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the storage unit 180 using an SDR (Single Data Rate) protocol or a DDR (Double Data Rate) protocol, such as ONFI (open NAND flash interface), DDR toggle, or others. The processing unit 110 may communicate with the host device 160 through an access interface 150 using a standard protocol, such as USB (Universal Serial Bus), ATA (Advanced Technology Attachment), SATA (Serial ATA), PCI-E (Peripheral Component Interconnect Express) or others.

Figure 2:
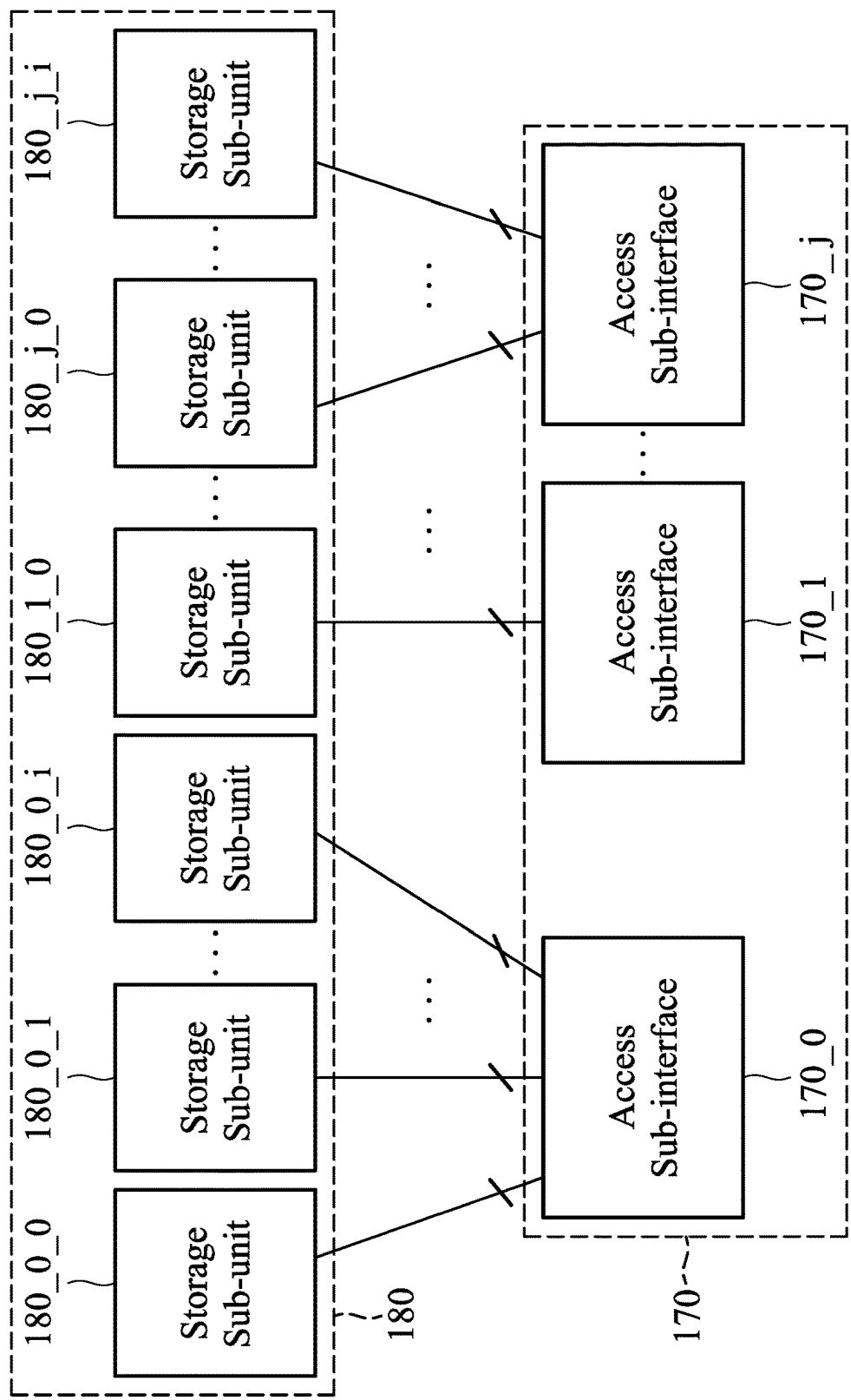
FIG. 2 is a schematic diagram illustrating interfaces to storage units of a flash storage according to an embodiment of the invention.
Figure 3:
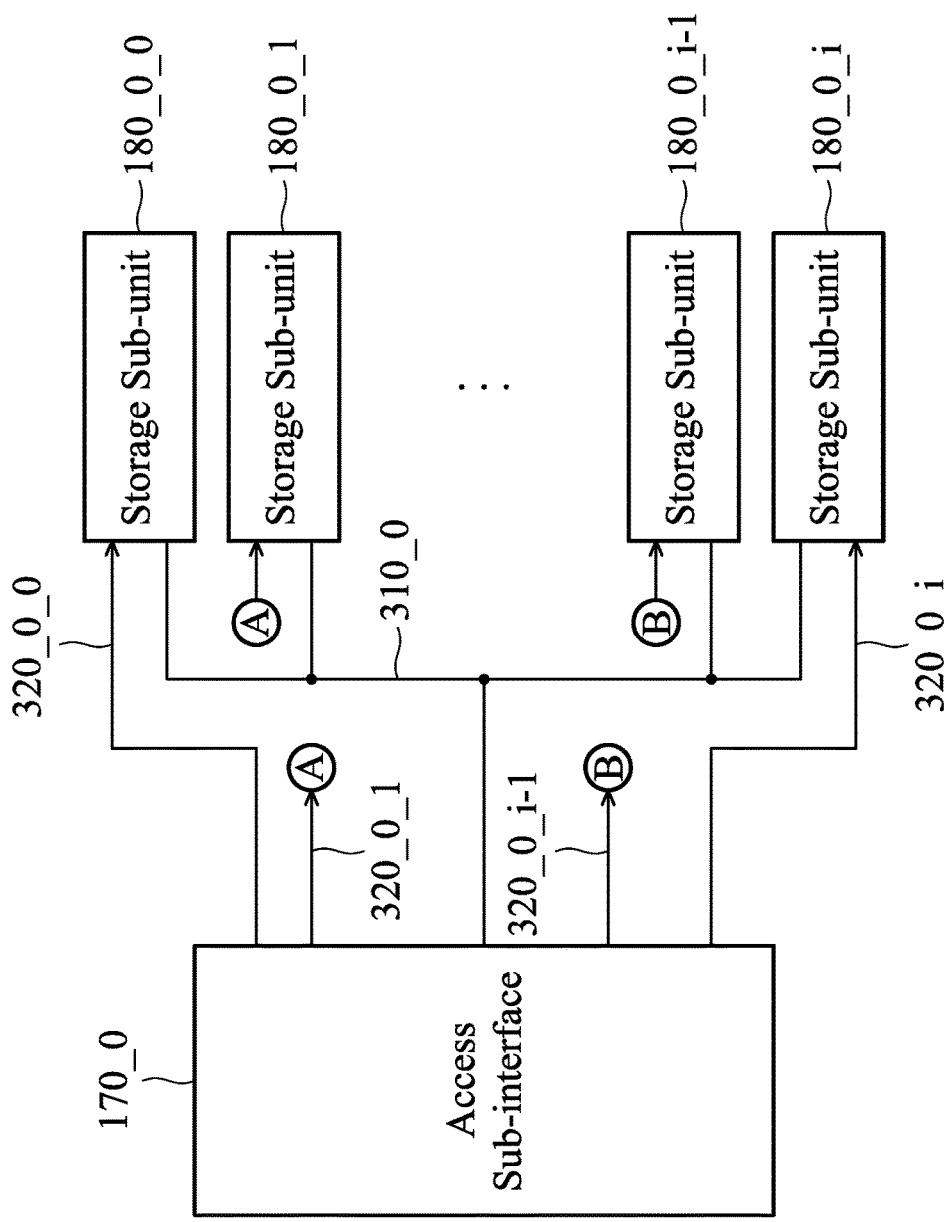
FIG. 3 is a schematic diagram depicting connections between one access sub-interface and multiple storage sub-units according to an embodiment of the invention.

The storage unit 180 may contain multiple storage sub-units and each storage sub-unit may be practiced in a single die and use a respective access sub-interface to communicate with the processing unit 110. FIG. 2 is a schematic diagram illustrating interfaces to storage units of a flash storage according to an embodiment of the invention. The flash memory 10 may contain j+1 access sub-interfaces 170_0 to 170_j, where the access sub-interfaces may be referred to as channels, and each access sub-interface connects to i+1 storage sub-units. That is, i+1 storage sub-units may share the same access sub-interface. For example, assume that the flash memory contains 4 channels (j=3) and each channel connects to 4 storage sub-units (i=3): The flash memory 10 has 16 storage sub-units 180_0_0 to 180_j_i in total. The processing unit 110 may direct one of the access sub-interfaces 170_0 to 170_j to program data into the designated storage sub-unit. Each storage sub-unit has an independent CE control signal. That is, it is required to enable a corresponding CE control signal when attempting to perform data programming into a designated storage sub-unit via an associated access sub-interface. It is apparent that any number of channels may be provided in the flash memory 10, and each channel may be associated with any number of storage sub-units, and the invention should not be limited thereto. FIG. 3 is a schematic diagram depicting connections between one access sub-interface and multiple storage sub-units according to an embodiment of the invention. The processing unit 110, through the access sub-interface 170_0, may use independent CE control signals 320_0_0 to 320_0_i to select one of the connected storage sub-units 180_0_0 and 180_0_i, and then program data into the designated location of the selected storage sub-unit via the shared data line 310_0.

Figure 4:
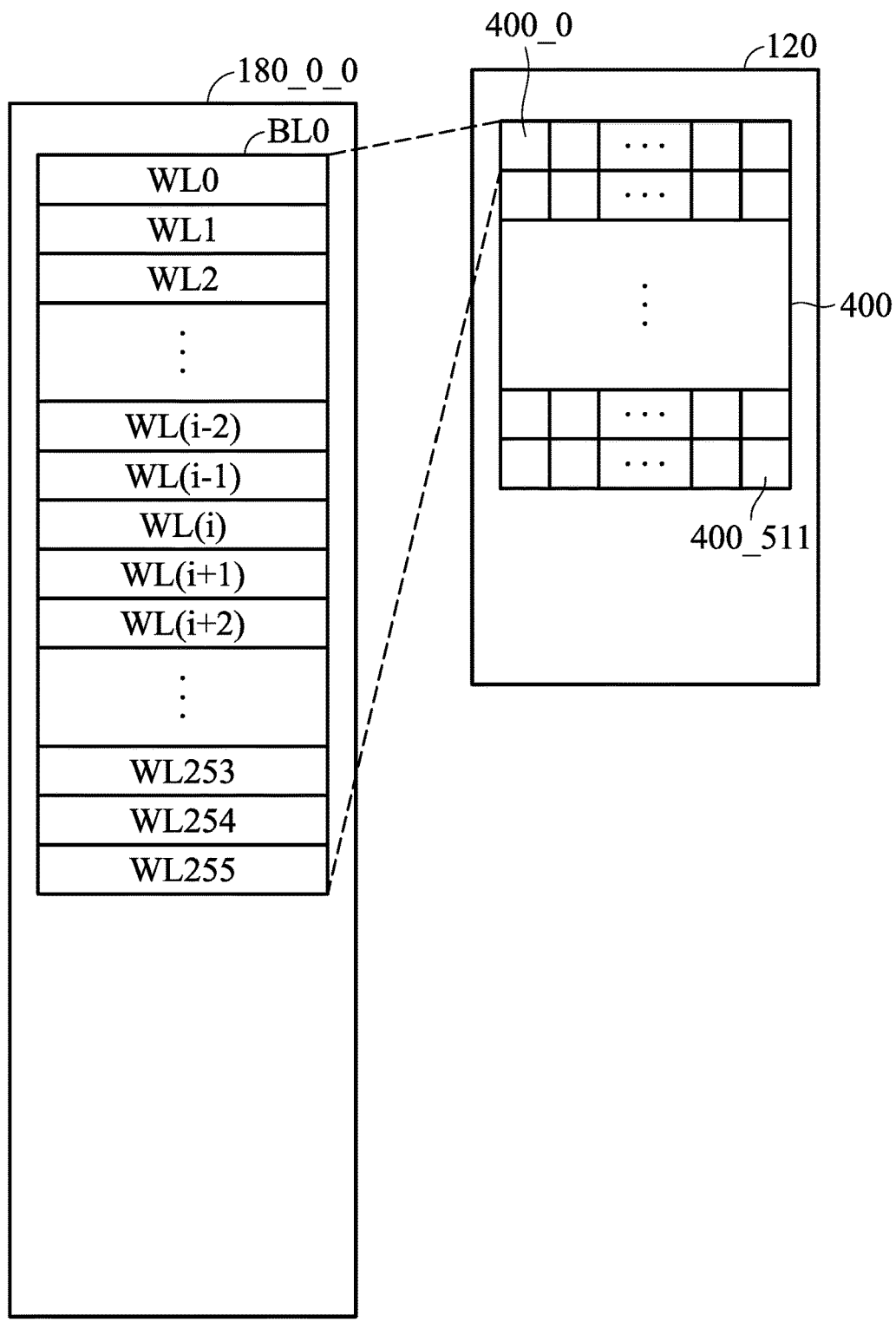
FIGS. 4 and 5 are schematic diagrams illustrating projections of data of a read-count table to physical blocks according to an embodiment of the invention.
Figure 5:
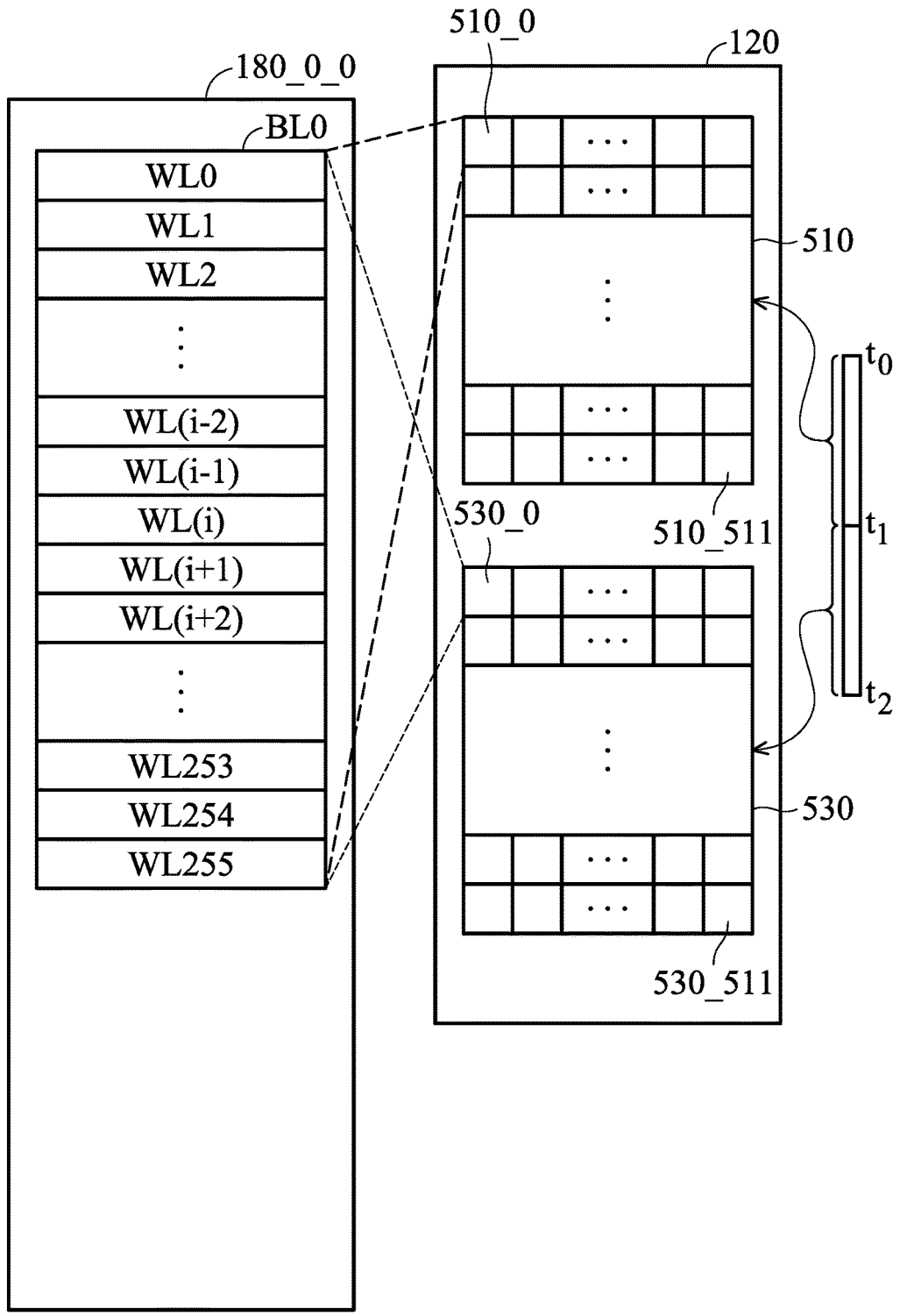

FIGS. 4 and 5 are schematic diagrams illustrating projections of data of a read-count table to physical blocks according to an embodiment of the invention. Memory cells of the storage unit 180 may be segmented into m physical blocks, each physical block may contain n physical pages and data of each physical page may be programmed on p wordline(s). The storage unit 180 may contain 512 physical blocks, each physical block may contain 256 physical pages and data of each physical page may be programmed on one wordline. For example, the storage sub-unit 180_0_0 at least contains the $0^{th}$ physical block BL0, the $0^{th}$ physical block BL0 at least contains 256 wordlines WL0 to WL255 and each wordline stores data of one page. The system architecture 10 of the flash memory contains a volatile memory 120 to store necessary data in execution, such as variables, data tables, data abstracts, etc.

Refer to FIG. 4. In some embodiments, the volatile memory 120 stores a read-count table 400 containing m cells and each cell records the total number of reads of a physical block since the last erase. For example, the read-count table 400 contains 512 cells 400_0 to 400_511 and the $0^{th}$ cell 400_0 records the total number of reads of the physical block BL0 since the last erase. When a physical block is erased, the value of the corresponding cell is renewed to 0. After a successful booting, the processing unit 110 reads the read-count table 400 from the storage unit 180 through the access interface 170 and stores the read-count table 400 in the volatile memory 120. The read-count table 400 of the volatile memory 120 is updated after data is read from the storage unit 180. Before a system shutdown, the processing unit 110 programs the read-count table 400 of the volatile memory 120 into the storage unit 180 through the access interface 170.

Refer to FIG. 5. In some other embodiments, the volatile memory 120 may additionally store read-count tables 510 and 530. The read-count table 510 contains m cells and each cell records the total number of reads of a physical block in a period of time between $t_0$ and $t_1$. The read-count table 530 contains m cells and each cell records the total number of reads of a physical block in a period of time between $t_1$ and $t_2$. For example, the read-count table 510 contains 512 cells 510_0 to 510_511 and the $0^{th}$ cell 510_0 records the total number of reads of the physical block BL0 in a period of time between $t_0$ and $t_1$. The read-count table 530 contains 512 cells 530_0 to 530_511 and the $0^{th}$ cell 530_0 records the total number of reads of the physical block BL0 in a period of time between $t_1$ and $t_2$. It should be noted that, since the volatile memory 120 is a scarce resource, the read counts of the read-count tables 400, 510 and 530 are recorded in physical blocks as basic units, rather than in physical pages. Although the embodiments of FIGS. 4 and 5 describe one physical page being programmed into one storage sub-unit, those skilled in the art may realize that one physical page is programmed across multiple storage sub-units and the invention should not be limited thereto.

Figure 6:
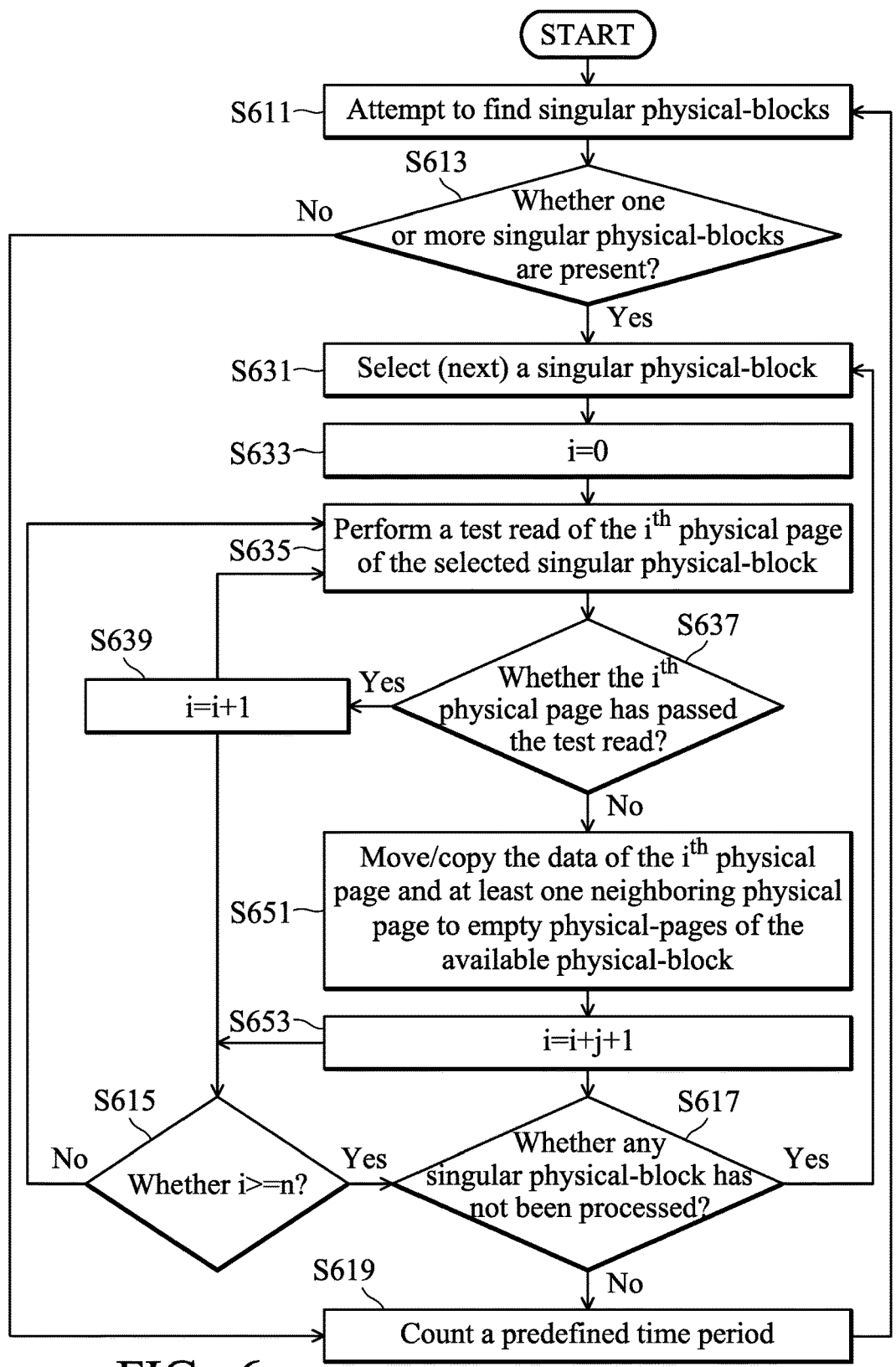
FIG. 6 is a flowchart illustrating a method for migrating data to avoid read disturbance according to an embodiment of the invention.

FIG. 6 is a flowchart illustrating a method for migrating data to avoid read disturbance according to an embodiment of the invention. The method is performed when the processing unit 110 loads and executes relevant program code. The method is periodically performed, for example, every 10, 20 or 30 minutes. In each iteration, it is attempted to find singular physical-blocks (step S611) and determined whether one or more singular physical-blocks are present (step S613). When one or more singular physical-blocks are present (the "Yes" path of step S613), it is determined whether read disturbance has happened in the physical pages of the singular physical-block(s) and data of corresponding physical pages affected by the read disturbance is moved/copied to empty pages of an available physical-block (steps S631 to S653). When no singular physical-block is present (the "No" path of step S613), a predefined time period is counted (step S619). When the predefined time period is reached, the next iteration starts. Refer to FIG. 4. In some embodiments of step S611, the processing unit 110 may determine whether a value (also called a read count) of each cell of the read-count table 400 exceeds a threshold, such as 76800, 51200, 25600 or another value set before leaving the factory. When at least a value of one cell exceeds the threshold, the processing unit 110 determines that the physical blocks associated with the cells are singular physical-blocks. For example, when the value of the cell 400_0 exceeds the threshold, the processing unit 110 determines that the physical block BL0 is a singular physical-block. Refer to FIG. 5. In some other embodiments of step S611, the processing unit 110 subtracts the value (also called the first read count) of the $k^{th}$ cell of the read-count table 510 from the value (also called the second read count) of the $k^{th}$ cell of the read-count table 530 and writes the calculated value (also called the third read count) into the $k^{th}$ cell of a temporary table where k is an arbitrary value between 0 to m−1. Subsequently, the processing unit 110 determines whether data disturbance has happened according to the values of the temporary table. In some implementations, it may determine whether any value of the temporary table exceeds a predefined threshold. In some other implementations, it may determine whether any value of the temporary table is far more than an average of all values, for example, whether a value of any cell exceeds a predetermined times (such as, 5 times, 10 times, etc.) of an average of values of all cells. For example, when the value of the $0^{th}$ cell of the temporary table exceeds a predefined threshold or a predetermined times of an average of values of all cells, the processing unit 110 determines that the physical block BL0 is a singular physical-block.

When a singular physical-block is selected (step S631), the variable i is used to control test reads to physical pages of this singular physical-block. Details of test reads to physical pages of the singular physical-block are described as follows: The variable i is initiated as 0 (step S633) and a test read of the $0^{th}$ physical page of this singular physical-block is performed (step S635). Subsequently, it is determined whether the $0^{th}$ physical page has passed the test read (step S637). In steps S635 and S637, specifically, the processing unit 110 directs the access interface 170 to read the $0^{th}$ physical page of this singular physical-block and send the data to the ECC (Error Check-and-Correction) unit 130 and obtains a result that implicitly or explicitly indicates whether the data of the $0^{th}$ physical page has passed ECC from the ECC unit 130. The ECC unit 130 may output a message to indicate the erroneous extent of the data of the $0^{th}$ physical page of this singular physical-block. The processing unit 110 determines that the data of the $0^{th}$ physical page of this singular physical-block has not passed the test read when an error level of the data of the $0^{th}$ physical page of this singular physical-block reaches a predefined level or worse, or, when the error bits of the data of the $0^{th}$ physical page of this singular physical-block exceeds a predefined threshold. For example, the error level may be a message indicating that the corrected bits of the $0^{th}$ physical page of this singular physical-block is high. When the data of the $0^{th}$ physical page has passed the test read (the "Yes" path of step S637), the variable i is increased by one (step S639) and a test read is performed on data of the $1^{st}$ (i.e. the next) physical page of this singular physical-block (steps S635 and S637). When the data of the $0^{th}$ physical page has not passed the test read (the "No" path of step S637), the data of the $0^{th}$ to the $j^{th}$ physical pages is moved/copied to empty physical-pages of an available physical-block (step S651), and then, the variable i is set to i+j+1, where j may be a constant of 1 or 2 (step S653). In step S653, specifically, since j is set to 1, the processing unit 110 directs the access interface 170 to move/copy the data of the $0^{th}$ to $1^{st}$ physical pages of this singular physical-block to empty physical pages of the available physical-block. Since j is set to 2, the processing unit 110 directs the access interface 170 to move/copy the data of the $0^{th}$ to $2^{nd}$ physical pages of this singular physical-block to empty physical-pages of the available physical-block. It should be understood that, when the data of the $0^{th}$ physical page of this singular physical-block has not passed the test read, the processing unit 110 determines that the data of the $1^{st}$ physical page of this singular physical-block has a high possibility of being read continuously and excessively to cause data disturbance to happen in the $0^{th}$ and $2^{nd}$ physical pages of this singular physical-block. If the data of the $1^{st}$ physical page is actually read continuously and excessively to cause data disturbance to happen in the $0^{th}$ and $2^{nd}$ physical pages of this singular physical-block and j is set to 2, the data of the $0^{th}$ and $2^{nd}$ physical pages affected by the data disturbance can be efficiently moved/copied to the available physical-block once. If the data of the $1^{st}$ physical page is not actually read continuously and excessively and j is set to 1, an unnecessary move/copy for the data of the $2^{nd}$ physical page is avoided.

When the variable i is greater than 0, a test read of the $i^{th}$ physical page of this singular physical-block is performed (step S635). Subsequently, it is determined whether the $i^{th}$ physical page has passed the test read (step S637). Details of steps S635 and S637 may refer to the aforementioned description and be omitted for brevity. When the data of the $i^{th}$ physical page has not passed the test read (the "No" path of step S637), the data of the $i-j^{th}$ to the $i+j^{th}$ physical pages is moved/copied to empty physical-pages of the available physical-block (step S651), and then, the variable i is set to i+j+1, where j may be a constant of 1 or 2 (step S653). In step S653, specifically, since j is set to 1, the processing unit 110 directs the access interface 170 to move/copy the data of the $(i-1)^{th}$ to $(i+1)^{th}$ physical pages of this singular physical-block to empty physical pages of the available physical-block. Since j is set to 2, the processing unit 110 directs the access interface 170 to move/copy the data of the $(i-2)^{th}$ to $(i+2)^{th}$ physical pages of this singular physical-block to empty physical-pages of the available physical-block. It should be noted that each physical block has boundary physical-pages. When i−j<0, data of the $0^{th}$ to $(i+j)^{th}$ physical pages are moved/copied to empty physical-pages of the available physical-block. When i+j>=n, data of the $(i-j)^{th}$ to $(n-1)^{th}$ physical pages are moved/copied to empty physical-pages of the available physical-block.

In each iteration of the test read for a physical page, after the variable i is updated (step S639 or S653), it is determined whether the variable i is greater than or equal to a total number n of physical pages of each physical block (step S615). When the variable i is less than n (the "No" path of step S615), a test read is performed on data of the $(i+1)^{th}$ or $(i+j+1)^{th}$ (i.e. the next) physical page (steps S635 and S637). When the variable i is greater than or equal to n (the "Yes" path of step S615), it is determined whether any singular physical-block has not been processed (step S617). When any singular physical-block has not been processed (the "Yes" path of step S617), the next singular physical-block is selected (step S631). When no singular physical-block needs to be processed (the "No" path of step S617), the predefined time period is counted (step S619).

Although the embodiment has been described as having specific elements in FIGS. 1 to 3, it should be noted that additional elements may be included to achieve better performance without departing from the spirit of the invention. While the process flow described in FIG. 6 includes a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for migrating data to avoid read disturbance, comprising:
   obtaining a plurality of first read counts corresponding to a plurality of physical blocks from a first read-count table, wherein each first read count indicates a total number of reads of one corresponding physical block in a time period between a first moment and a second moment;
   obtaining a plurality of second read counts corresponding to the physical blocks from a second read-count table, wherein each second read count indicates a total number of reads of one corresponding physical block in a time period between the second moment and a third moment;
   subtracting each first read count from one corresponding second read count to generate a plurality of third read counts;
   finding a singular physical-block from the physical blocks according to the third read counts;
   performing a test read on data of an $i^{th}$ physical page of the singular physical-block, wherein i is an integer that is greater than or equal to 0;
   determining whether the data of the $i^{th}$ physical page of the singular physical-block has passed the test read; and
   when the data of the $i^{th}$ physical page of the singular physical-block has not passed the test read, moving or copying data of the $i^{th}$ physical page and at least one neighboring physical-page of the singular physical-block to an available physical-block.

2. The method of claim 1, wherein the third read count corresponding to the singular physical-block exceeds a predefined threshold.

3. The method of claim 1, wherein the third read count corresponding to the singular physical-block exceeds a predetermined times of an average of all third read counts.

4. The method of claim 1, wherein the data of the $i^{th}$ physical page is programmed on a first wordline, the neighboring physical-page is programmed on a second wordline and the first wordline is next to the second wordline.

5. The method of claim 1, wherein the $i^{th}$ physical page and at least one neighboring physical-page contains the $(i-1)^{th}$ physical page to the $(i+1)^{th}$ physical page.

6. The method of claim 1, wherein the $i^{th}$ physical page and at least one neighboring physical-page contains the $(i-2)^{th}$ physical page to the $(i+2)^{th}$ physical page.

7. The method of claim 1, wherein the step for performing a test read on data of the $i^{th}$ physical page of the singular physical-block comprises:
   directing an access interface to read the data from the $i^{th}$ physical page of the singular physical-block and send the data to an ECC (Error Check-and-Correction) unit,
   the step for determining whether the data of the $i^{th}$ physical page of the singular physical-block has passed the test read comprises:
   obtaining a result from the ECC unit; and
   determining whether the data of the $i^{th}$ physical page of the singular physical-block has passed the test read according to the result.

8. The method of claim 7, wherein the result indicates an erroneous extent of the data of the $i^{th}$ physical page of the singular physical-block.

9. The method of claim 8, wherein the result indicates an error level of the data of the $i^{th}$ physical page of the singular physical-block, the step for determining whether the data of the $i^{th}$ physical page of the singular physical-block has passed the test read according to the result comprises:
   determining whether the error level of the data of the $i^{th}$ physical page of the singular physical-block reaches a predefined level or worse, and
   the data of the $i^{th}$ physical page of the singular physical-block has not passed the test read when the error level of the data of the $i^{th}$ physical page of the singular physical-block reaches the predefined level or worse.

10. The method of claim 8, wherein the result indicates error bits of the data of the $i^{th}$ physical page of the singular physical-block, the step for determining whether the data of the $i^{th}$ physical page of the singular physical block has passed the test read according to the result comprises:
    determining whether the error bits of the data of the $i^{th}$ physical page of the singular physical-block exceeds a predefined threshold, and
    the data of the $i^{th}$ physical page of the singular physical block has not passed the test read when the error bits of the data of the $i^{th}$ physical page of the singular physical-block exceeds the predefined threshold.

11. An apparatus for migrating data to avoid read disturbance, comprising:
    a volatile memory storing a first read-count table and a second read-count table;
    an access interface coupled to a storage unit comprising a plurality of physical blocks; and
    a processing unit, coupled to the access interface, obtaining a plurality of first read counts corresponding to the physical blocks from the first read-count table, wherein each first read count indicates a total number of reads of one corresponding physical block in a time period between a first moment and a second moment; obtaining a plurality of second read counts corresponding to the physical blocks from the second read-count table, wherein each second read count indicates a total number of reads of one corresponding physical block in a time period between the second moment and a third moment; subtracting each first read count from one corresponding second read count to generate a plurality of third read counts; finding a singular physical-block from the physical blocks according to the third read counts; performing a test read on data of an $i^{th}$ physical page of the singular physical-block, wherein i is an integer that is greater than or equal to 0; determining whether the data of the $i^{th}$ physical page of the singular physical block has passed the test read; and when the data of the $i^{th}$ physical page of the singular physical block has not passed the test read, directing the access interface to move or copy data of the $i^{th}$ physical page and at least one neighboring physical-page of the singular physical block to an available physical-block.

12. The apparatus of claim 11, wherein the third read count corresponding to the singular physical-block exceeds a predefined threshold.

13. The apparatus of claim 11, wherein the third read count corresponding to the singular physical-block exceeds a predetermined times of an average of all third read counts.

14. The apparatus of claim 11, wherein the data of the $i^{th}$ physical page is programmed on a first wordline, the neighboring physical-page is programmed on a second wordline and the first wordline is next to the second wordline.

15. The apparatus of claim 11, wherein the $i^{th}$ physical page and at least one neighboring physical-page contains the $(i-1)^{th}$ physical page to the $(i+1)^{th}$ physical page.

16. The apparatus of claim 11, wherein the $i^{th}$ physical page and at least one neighboring physical-page contains the $(i-2)^{th}$ physical page to the $(i+2)^{th}$ physical page.

17. The apparatus of claim 11, comprising:
an ECC (Error Check-and-Correction) unit,
wherein the processing unit directs the access interface to read the data from the $i^{th}$ physical page of the singular physical-block and send the data to the ECC unit; obtains a result from the ECC unit; and determines whether the data of the $i^{th}$ physical page of the singular physical block has passed the test read according to the result.

18. The apparatus of claim 17, wherein the result indicates an erroneous extent of the data of the $i^{th}$ physical page of the singular physical-block.

19. The apparatus of claim 18, wherein the result indicates an error level of the data of the $i^{th}$ physical page of the singular physical-block and the processing unit determines whether the error level of the data of the $i^{th}$ physical page of the singular physical-block reaches a predefined level or worse; and determines that the data of the $i^{th}$ physical page of the singular physical block has not passed the test read when the error level of the data of the $i^{th}$ physical page of the singular physical-block reaches the predefined level or worse.

20. The apparatus of claim 18, wherein the result indicates error bits of the data of the $i^{th}$ physical page of the singular physical-block, and the processing unit determines whether the error bits of the data of the $i^{th}$ physical page of the singular physical-block exceeds a predefined threshold and determines that the data of the $i^{th}$ physical page of the singular physical block has not passed the test read when the error bits of the data of the $i^{th}$ physical page of the singular physical-block exceeds the predefined threshold.

* * * * *